(12) United States Patent
Collins et al.

(10) Patent No.: US 11,190,178 B1
(45) Date of Patent: Nov. 30, 2021

(54) GATE INDUCED DRAIN LEAKAGE ROBUST BOOTSTRAPPED SWITCH

(71) Applicant: XILINX, INC., San Jose, CA (US)

(72) Inventors: Diarmuid Collins, Dunshaughlin (IE); Edward Cullen, Kildare (IE); Ionut C. Cical, Saggart (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/083,191

(22) Filed: Oct. 28, 2020

(51) Int. Cl.
*H03K 17/16* (2006.01)
*H03K 17/687* (2006.01)
*H03K 17/693* (2006.01)
*G05F 1/10* (2006.01)
*G05F 1/12* (2006.01)
*H03K 17/08* (2006.01)
*H03K 17/06* (2006.01)

(52) U.S. Cl.
CPC ......... *H03K 17/165* (2013.01); *H03K 17/063* (2013.01); *H03K 17/08* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 6,057,998 A | * | 5/2000 | Sakamoto | H03K 17/0822 361/103 |
| 7,385,433 B2 | * | 6/2008 | Callahan, Jr. | H03K 17/162 327/534 |
| 7,514,983 B2 | * | 4/2009 | Miske | H03K 17/08142 327/534 |
| 7,746,152 B2 | * | 6/2010 | Nakatani | H03K 17/6871 327/389 |
| 8,228,109 B2 | * | 7/2012 | Stockinger | H03K 17/102 327/318 |
| 8,860,497 B1 | * | 10/2014 | Pattnayak | H03K 17/0822 327/534 |
| 8,981,843 B2 | * | 3/2015 | Gagne | H02M 3/07 327/589 |
| 9,245,886 B2 | * | 1/2016 | Jennings | H03K 17/08122 |
| 9,893,723 B1 | * | 2/2018 | Garofalo | G11C 7/08 |
| 10,164,624 B2 | * | 12/2018 | Garofalo | G11C 7/08 |
| 10,236,873 B2 | | 3/2019 | Cical et al. | |
| 10,972,096 B2 | * | 4/2021 | Mertens | H03K 17/6872 |

* cited by examiner

*Primary Examiner* — Kenneth B Wells
(74) *Attorney, Agent, or Firm* — Patterson + Sheridan, LLP

(57) ABSTRACT

Examples described herein provide an apparatus having a circuit with a grounding circuit and a switch. The apparatus generally includes a gate induced drain leakage (GIDL) protection circuit coupled to the switch and to an output voltage. The GIDL protection circuit may include a switch protection circuit configured to maintain a drain voltage of the switch less than a first supply voltage ($V_{dd}$) when the circuit is in an OFF state; and a ground protection circuit configured to maintain a drain voltage of the grounding circuit less than the first supply voltage when the circuit is in an ON state.

20 Claims, 9 Drawing Sheets

US 11,190,178 B1

GATE INDUCED DRAIN LEAKAGE ROBUST BOOTSTRAPPED SWITCH

TECHNICAL FIELD

Examples of the present disclosure generally relate to gate induced drain leakage (GIDL) prevention and, in particular, to prevent GIDL in a bootstrapped switch.

BACKGROUND

Gate induced drain leakage (GIDL) occurs due to band-to-band tunneling as a direct result of high electric fields generated at the gate drain overlap when a device (e.g., a transistor) is in an OFF state. GIDL occurs in both PMOS and NMOS devices. In an NMOS device in its OFF state (e.g., $V_g=0V$), when $V_d$ is greater than $V_g$ (e.g., $V_d=0.7\ V$), a large electric field at the drain gate overlap can generate band-to-band tunneling. The band-to-band tunneling creates free electrons, which flow to the drain potential, hence producing a leakage current from the drain into the substrate. In a PMOS device in its OFF state (e.g., $V_g=V_{dd}$), when $V_d$ is greater than $V_g$ (e.g., by at least 0.7 V), a large electric field at the drain gate overlap can generate band-to-band tunneling. The band-to-band tunneling creates holes, thus leading to electron flow into the substrate, which in turn produces a leakage current from the substrate to the drain.

GIDL becomes a leakage source in technologies with thin oxides. Specifically, GIDL becomes significant when the voltages between the gate and drain ($V_{gd}$) reduces with scaling due to thinner oxides producing higher electric fields. For example, for 7 nm oxides, GIDL starts to account for more than ten percent of total device leakage for $V_{gd}$ greater than 0.7V ($V_{gd}<-0.7V$ for NMOS and $V_{gd}>0.7V$ for PMOS).

High internal voltages may make circuits, like bootstrap switches, susceptible to GIDL in an ON state, which, if not addressed, can lead to significant leakage of the switch gate to dramatically increase its ON resistance. In a circuit's OFF state, GIDL in the circuit can significantly load circuitry connected to the output net of the circuit.

Accordingly, what is needed is a way to address GIDL issues by either eliminating or limiting GIDL at critical points within a circuit.

SUMMARY

These and other aspects may be understood with reference to the following detailed description. One example is a circuit having a grounding circuit, a switch and a gate induced drain leakage (GIDL) protection circuit coupled to the switch and to an output voltage. The GIDL protection circuit may comprise a switch protection circuit configured to maintain a drain voltage of the switch less than a first supply voltage (Vdd) when the circuit is in an OFF state; and a ground protection circuit configured to maintain a drain voltage of the grounding circuit less than the first supply voltage when the circuit is in an ON state.

Another example is an apparatus comprising a switch circuit and a gate induced drain leakage (GIDL) protection circuit. The switch circuit may comprise a transistor, a first gate transistor, and a second gate transistor. The GIDL protection circuit may be coupled to the switch circuit and may comprise a first transistor circuit coupled to a gate and a drain of the transistor and a second transistor circuit coupled to the first transistor circuit and to the drain of the first gate transistor.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
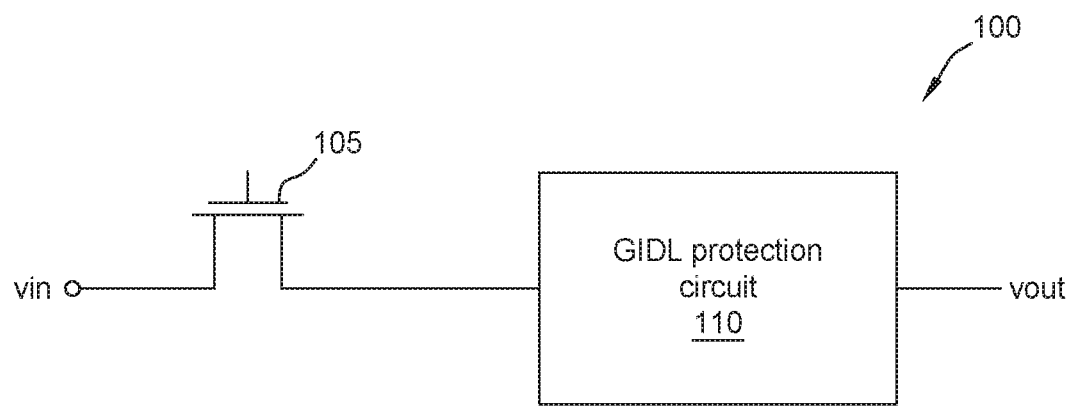
FIG. 1 illustrates a circuit having a gate-induced drain leakage (GIDL) protection circuit, according to one example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein relate to gate induce drain leakage (GIDL) and preventing GIDL. The techniques disclosed herein can be used with any transistors that are susceptible to GIDL, but may be particularly useful for transistors having thin (e.g., 0.7 nm) oxides as GIDL may affect the performance of those types of transistors more than transistors with thicker gate oxides. As described herein, a GIDL protection circuit mitigates or eliminates GIDL from a circuit (e.g., a bootstrapped switch) or limits the amount of GIDL from a transistor. Accordingly, examples herein relate to an apparatus comprising: a circuit having a grounding circuit (M9 and M10), a switch (M8), and a GIDL protection circuit coupled to the switch and to an output voltage. In the examples, the GIDL protection circuit may include a switch protection circuit configured to maintain a drain voltage of the switch less than a first supply voltage (Vdd) when the circuit is in an OFF state; and a ground protection circuit configured to maintain a drain voltage of the grounding circuit less than the first supply voltage when the circuit is in an ON state.

FIG. 1 illustrates a circuit 100 having a transistor 105 and a GIDL protection circuit 110. While examples described herein discuss the GIDL protection circuit 110 with relation to a particular circuit, techniques for the GIDL protection circuit 110 may be used with any type of circuit having transistors with GIDL issues. The circuit 100 may have any number of electrical components (e.g., capacitors, transistors). As described herein, the GIDL protection circuit 110 can prevent or limit the GIDL experienced by the transistor 105.

Figure 2:
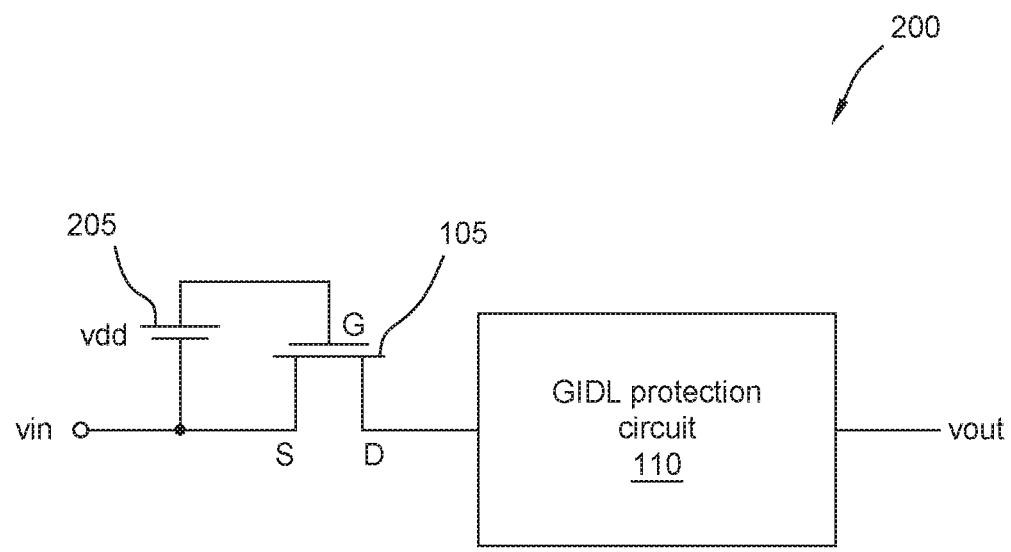
FIG. 2 illustrates a bootstrapped circuit having the GIDL protection circuit, according to one example.

FIG. 2 illustrates a bootstrapped circuit 200 that uses the GIDL protection circuit 110 of FIG. 1. Generally, a bootstrapped circuit 200 includes a power supply 205 coupled between the source and gate of a transistor 105. The power supply 205 provides a constant voltage ($V_{gs}$) between the source (S) and gate (G) of the transistor 105, and thus, the transistor 105 may have a constant ON resistance regardless of the input signal $V_{in}$. A bootstrapped circuit 200 can resolve some GIDL issues for the transistor 105 when the circuit 200 is in an ON state (e.g., the transistor 105 provides voltage greater than 0 at the gate of the transistor 105). However, a bootstrapped circuit 200 provides no means to deal with GIDL into the transistor 105 when the transistor 105 is in an OFF state. Accordingly, the GIDL protection circuit 110 can mitigate GIDL into the transistor 105 and into the bootstrapped circuit 200 in the OFF state and in the ON state.

As illustrated, a GIDL protection circuit 110 is disposed between the transistor 105 and $V_{out}$. As mentioned, the GIDL protection circuit 110 can prevent GIDL from the transistor by limiting the voltage difference between the gate (G) and the drain (D) of the transistor 105 in an OFF and an ON state.

Figure 3:
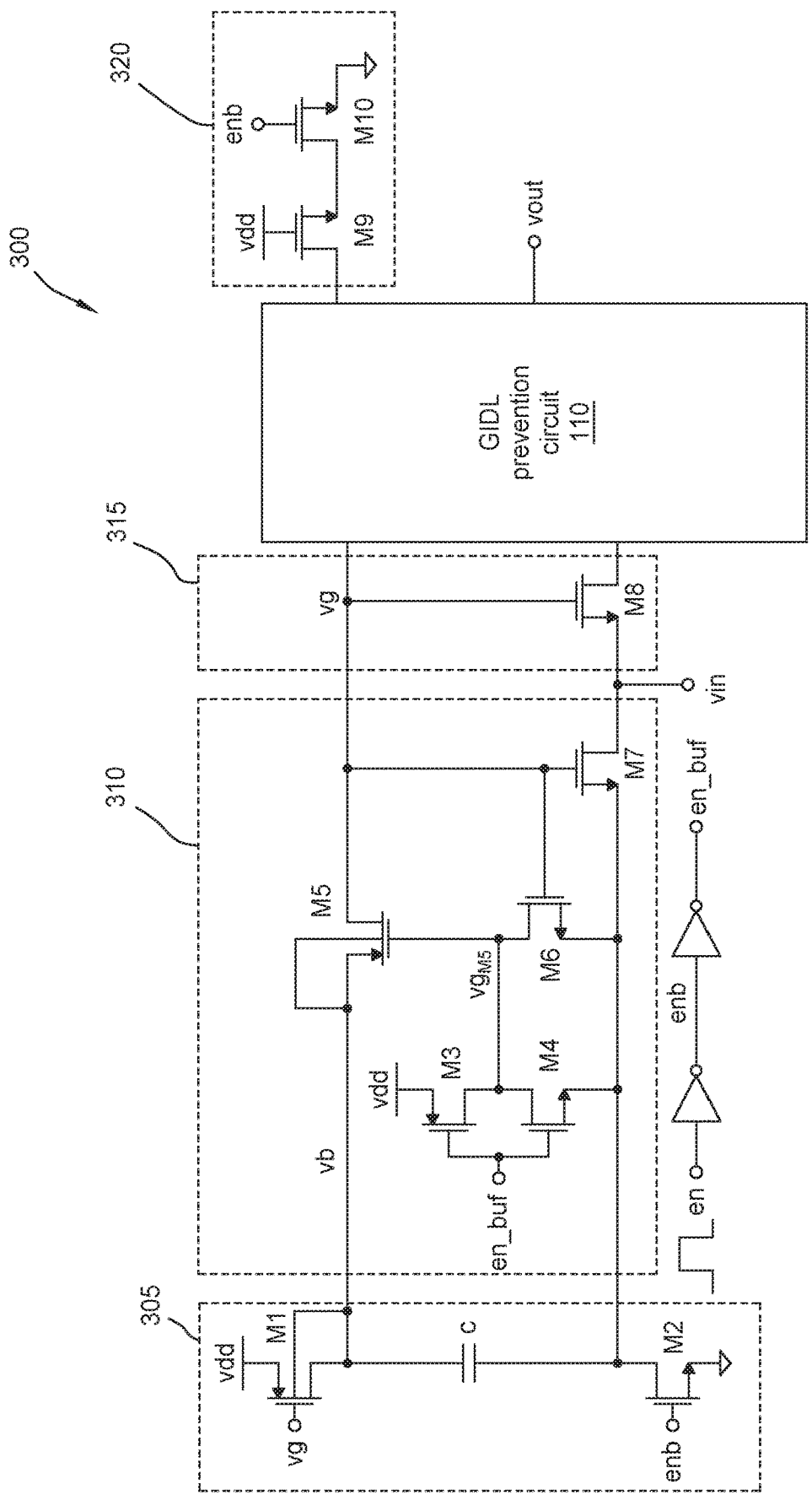
FIG. 3 illustrates a detailed diagram of the bootstrapped circuit having the GIDL protection circuit, according to one example.

FIG. 3 illustrates a bootstrapped circuit 300 with a GIDL protection circuit 110. The bootstrapped circuit 300 comprises a power supply circuit 305, an enable circuit 310, a switch circuit 315, and a grounding circuit 320. The GIDL protection circuit 110 may be disposed between the switch circuit 315 (e.g., between the drain and the gate of transistor M8) and the grounding circuit 320 and $V_{out}$.

The power supply circuit 305 includes a first transistor M1, a second transistor M2, and a capacitor C. Transistor M1 is connected to supply voltage $V_{dd}$ at its source, and to voltage $V_g$ at its gate. Transistor M2 is connected to ground voltage at its source and to an inverted enable signal at its gate. Both transistors M1 and M2 are connected to capacitor C via their respective drains. This circuit components act as the power supply 205 illustrated in FIG. 2.

The enable circuit 310 includes a third transistor M3, a fourth transistor M4, a fifth transistor M5, a sixth transistor M6, and a seventh transistor M7.

As illustrated in FIG. 3, the gates of both transistors M3 and M4 are connected to a buffered enable signal (en_buf). The source of transistor M3 is connected to the supply voltage $V_{dd}$ and the source of transistor M4 is connected to the drain of transistor M2 of the power supply circuit 305. The drains of transistors M3 and M4 are connected together to the gate of transistor M5 and to the drain of transistor M6. The source of transistor M5 is connected to the power supply circuit 305, and the drain of transistor M5 is connected to the gates of transistors M6 and M7. The drain of transistor M5 is also connected to the gate of the transistor M8 of the switch circuit 315.

In some examples, the enable circuit receives the buffered enable signal (en_buf). When the buffered enable signal is high, the enable circuit 310 allows current to flow from the supply voltage $V_{dd}$ through transistors M3 and M4, and thus the voltage at the drains of transistors M3 and M4 is high. Because of the high voltage at the drains of transistors M3 and M4, the gate voltage of transistor M5 is high which enables current to flow from the source to the drain of transistor M5 (i.e., turns on the transistor M5). Correspondingly, the voltage at the gates of transistors M6 and M7 of the enable circuit and at the gate of transistor M8 of the switch circuit 315 goes high. Summarily, when the buffered enable signal goes high, transistor M8 of the switch circuit 315 is enabled and is therefore in the ON state.

As shown, the switch circuit 315 includes the transistor M8. The transistor M8 acts as a switch in response to the enable circuit 310, and together with the enable circuit 310, functions as the switch 105 illustrated in FIG. 2. As mentioned, the gate of the transistor M8 is connected to the drain of transistor M5, and to the gates of transistors M6 and M7. The transistor M8 is also connected to the GIDL protection circuit 110 via its gate and drain. The source of the transistor M8 is connected to the drain of transistor M7 of the enable circuit 310 and to the input voltage into the circuit 300.

The grounding circuit 320 includes a ninth transistor M9 and a tenth transistor M10. The drain of transistor M9 is connected to the gate of the transistor M8 and shares voltage $V_g$. Transistor M9 is connected to $V_{dd}$ at its gate, and transistor M9's source is connected in series to the drain of transistor M10. Transistor M10 is connected to the inverted enable signal (enb) at its gate, and transistor M10's source is connected to ground. The grounding circuit 320 is configured to electrically ground the GIDL protection circuit 110 and the other components of the circuit 300.

Generally, a bootstrapped circuit 300 is a clocked circuit. On one clock phase, transistors M1 and M2 turn on to charge capacitor C to $V_{dd}$ while the transistor M8 is turned off by discharging its gate voltage ($V_g$) to ground through transistor M10. In this clock phase, transistor M5 is off and transistor M9 is used to maintain $V_{ds_{10}}$ less than $V_{dd}$ for reliability. On the next clock phase, with transistors M1, M2, M9, and M10 turned off, transistor M5 turns on to pass $V_{dd}$ to $V_g$, which turns on transistor M7, having a source connected to the bottom plate of capacitor C and a drain connected to the source of transistor M8 ($V_{in}$). By turning on transistor M7, $V_{in}$ boosts $V_g$ to achieve a full $V_{dd}$ between the gate and source of transistor M8 (i.e., vs8=$V_{in}$, $V_g$=$V_{in}$+ $V_{dd}$ such that $V_{gs}$=$V_{dd}$). Accordingly, $V_{gs}$ may be maintained irrespective of the input signal.

As mentioned earlier, GIDL may occur in bootstrapped circuits, like the circuit in FIG. 3. Specifically, GIDL may occur in transistors M8 and M9 in circuit 300. Exaxmples herein describe implementations of the GIDL protection circuit 110 to mitigate or remove GIDL issues in transistors M8 and M9.

Figure 4A:
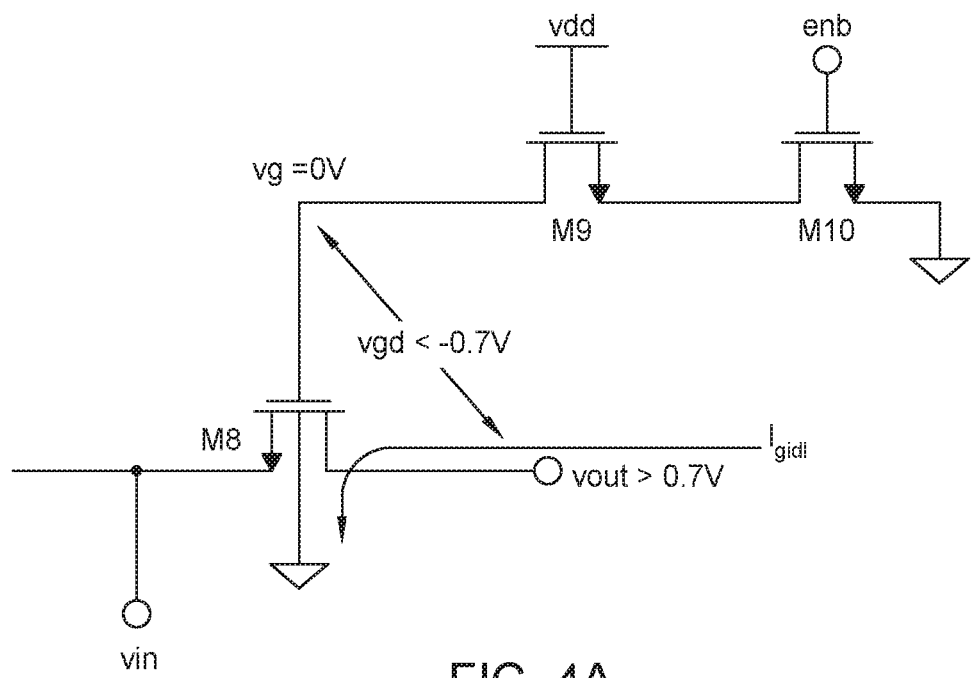
FIGS. 4A and 4B illustrates GIDL issues in bootstrapped circuits.
Figure 4B:
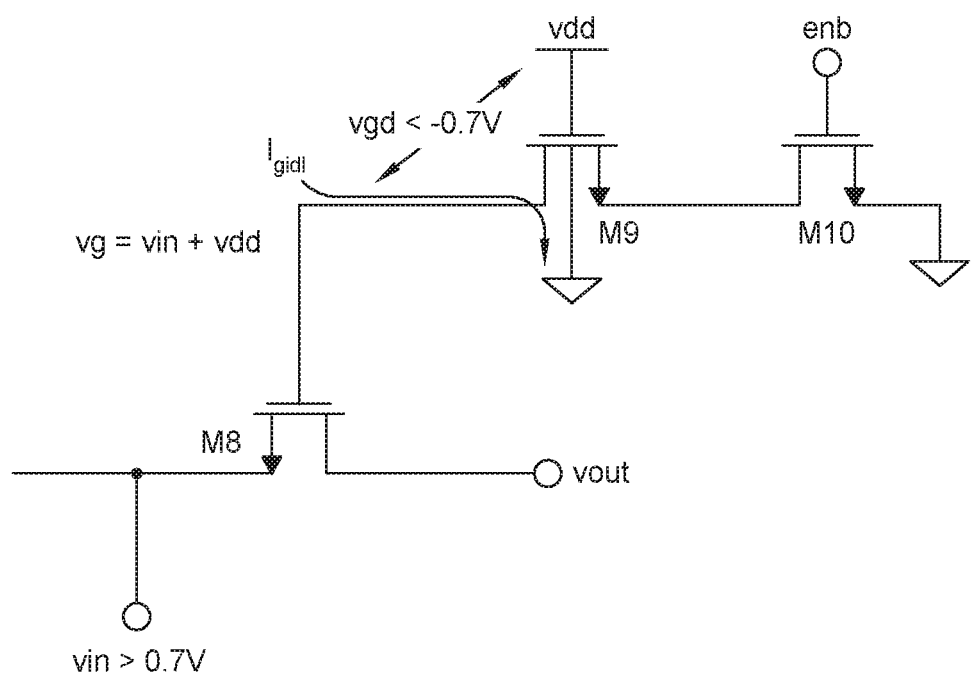

FIGS. 4A and 4B illustrate GIDL issues in bootstrapped circuits. As mentioned, GIDL issues may occur with a bootstrapped switch, for example, having transistors with 0.7 nm thin oxides. In a bootstrapped switch circuit, when the switch is turned off, $V_g$=0V and if Vow is greater than a GIDL threshold voltage (e.g., 0.7 V for 0.7 nm oxides), a current leak will flow into the drain of the transistor M8 to the substrate as illustrated in FIG. 4A. For a network with a large number of transistors (e.g., a bus network), the total leakage from the switches in the OFF state may produce significant IR drops on the line and limit accuracy performance.

Additionally, GIDL may cause issues when the transistor M8 is in the ON state. Specifically, leakage paths off the gate of transistor M8 can cause the voltage to droop over time and lead to an increasing time-varying ON resistance. FIG. 4B illustrates an example leakage path for transistor M9. With the example leakage path, the drain of transistor M9 gets boosted above $V_{dd}$ by more than the GIDL threshold voltage (e.g., 0.7V) and creates leakage into the drain of transistor M9 into the substrate.

According to some examples, GIDL into transistor M10 may be eliminated if $V_{dd}$ is less than or equal to the GIDL threshold. Otherwise, GIDL may be "self-limited" by transistor M9. As mentioned, examples herein involve a GIDL protection circuit configured to eliminate and/or limit the amount of GIDL into the transistors of a circuit.

Figure 5:
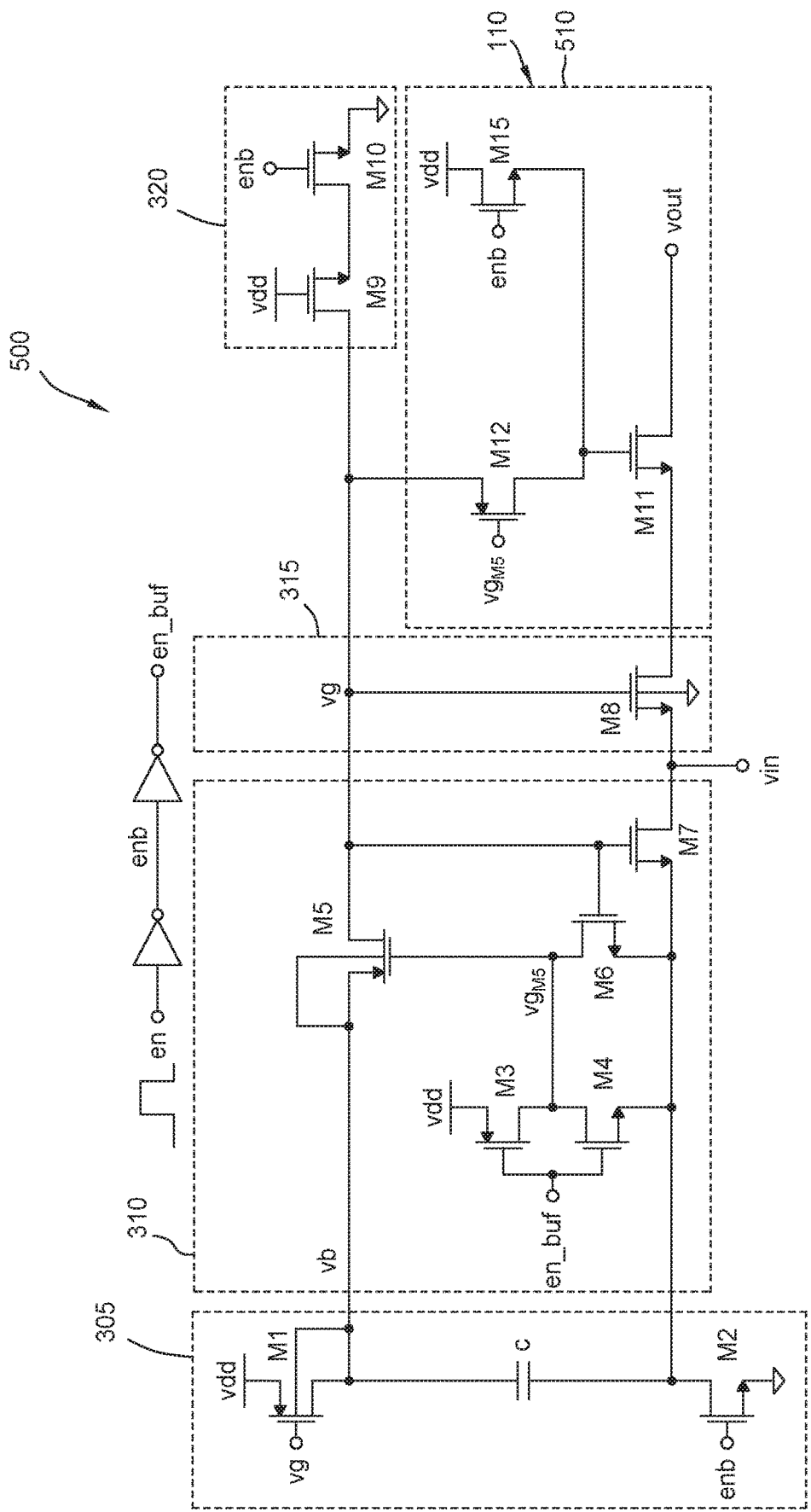
FIG. 5 illustrates components of the GIDL protection circuit, according to some examples.

FIG. 5 illustrates components of the GIDL protection circuit 110, according to some examples. As illustrated previously with FIG. 3, the circuit 500 includes the GIDL protection circuit 110 connected between the gate and drain of the transistor M8 of the switch circuit 315, the drain of transistor M9 of the grounding circuit 320, and the output voltage $V_{out}$.

As shown, the GIDL protection circuit 110 comprises a switch protection circuit 510 configured to protect the switch circuit 315—specifically, to prevent the voltage difference between the gate and the drain of the transistor M8 from exceeding a GIDL threshold. The switch protection circuit 510 is configured to prevent the GIDL issues illustrated in FIG. 4A. Accordingly, the switch protection circuit 510 is configured to maintain a drain voltage of the transistor M8 less than the supply voltage ($V_{dd}$) when the circuit 500 is in an OFF state.

The switch protection circuit 510 comprises transistors M11 and M15, and in some examples, the switch protection circuit 510 may include transistor M12. As illustrated in FIG. 5, the source of transistor M7 is coupled to the drain of transistor M8, and the gate of transistor M11 is coupled to the source of transistor M15. The drain of transistor M15 is coupled to Vdd, and the gate of transistor M15 is coupled to the inverted enable signal (enb).

In examples where the switch protection circuit 510 includes transistor M12, the source of transistor M12 is coupled to the gate of switch transistor M8 and the drain of transistor M12 is coupled to the gate of transistor M11. The voltage at the gate of M12 is the voltage at the gate of transistor M5 of the enable circuit 310. In some examples, the gate of transistor M12 may be electrically coupled to the gate of transistor M5 of the enable circuit 310.

As mentioned, the switch protection circuit 510 is configured to protect the switch circuit 315—specifically, to prevent the voltage difference between the gate and the drain of the transistor M8 from exceeding a GIDL threshold. In some examples, when the circuit is OFF (e.g., transistor M8 is OFF), the voltage at the gate of transistor M11 is pulled to supply voltage $V_{dd}$, which keeps the source of transistor M11 less than supply voltage $V_{dd}$. Assuming that supply voltage $V_{dd}$ is less than or equal to a GIDL threshold voltage, keeping the voltage at the source of transistor M11 less than supply voltage $V_{dd}$ eliminates GIDL into the drain of transistor M8 to the substrate. If supply voltage $V_{dd}$ is greater than a GIDL threshold voltage (e.g., 0.7 V), GIDL is not eliminated but significantly reduced because transistor M11 is "self-limiting." Transistor M11 "self-limits" because as GIDL increases, transistor M11's overdrive also increases, which decreases the drain of transistor M8 until a limiting point is reached. To increase its overdrive, transistor M11 is made small (which also improves primary-side regulation (PSR)). When the circuit is ON (e.g., transistor M8 is ON), the voltage at the gate of transistor M11 is pulled to the voltage at the gate of transistor M8 as a cascade onto transistor M8.

Figure 6:
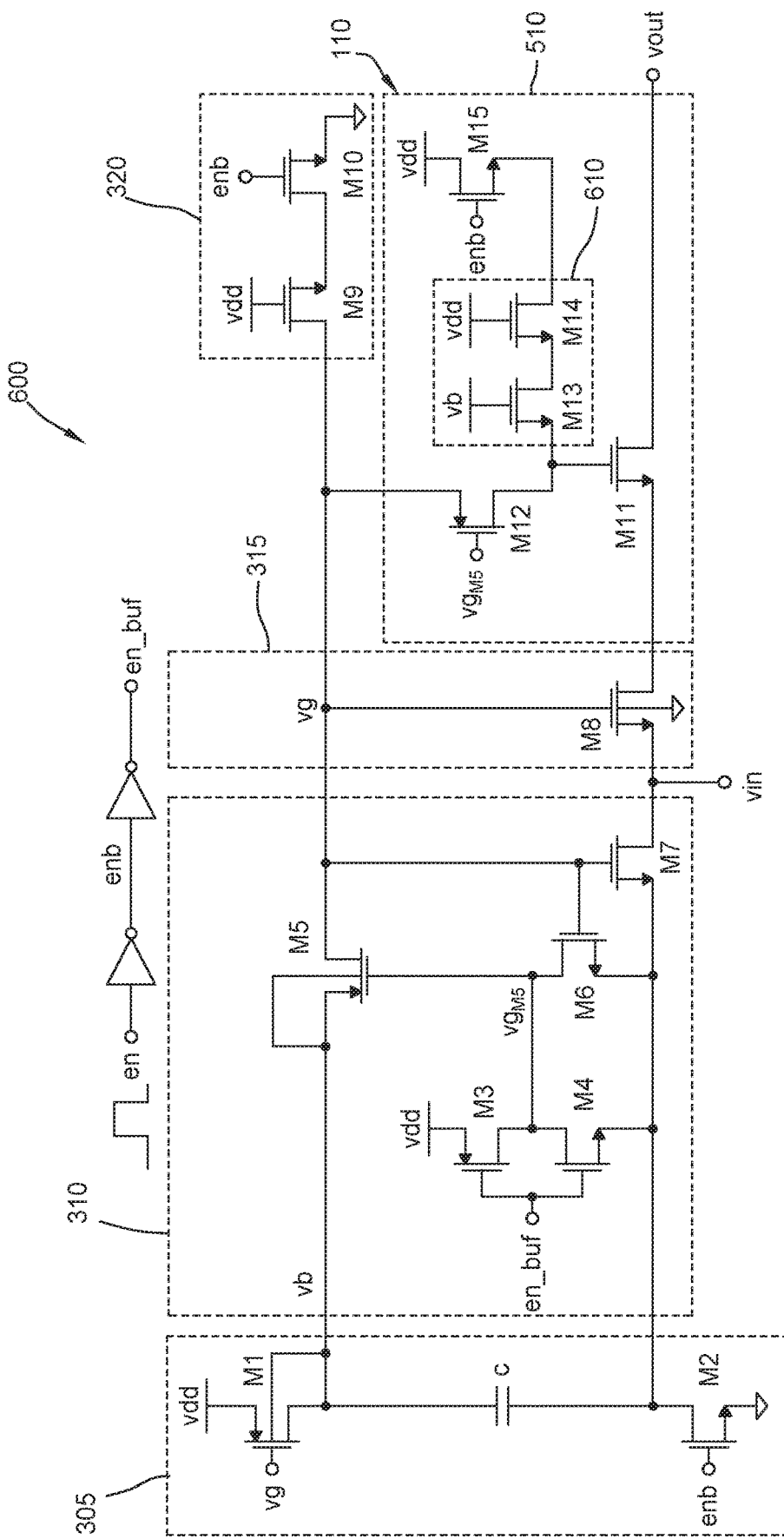
FIG. 6 illustrates components of the GIDL protection circuit, according to some examples.

FIG. 6 illustrates components of the GIDL protection circuit, according to some examples. As illustrated previously with FIGS. 3 and 5, the circuit 600 includes the GIDL protection circuit 110 connected between the gate and drain of the transistor M8 of the switch circuit 315, the drain of transistor M9 of the grounding circuit 320, and the output voltage $V_{out}$.

In some examples, the switch protection circuit 510 of the GIDL protection circuit 110 may comprise a GIDL supply voltage circuit 610. Similar to how the switch protection circuit 510 protects transistor M8 from GIDL issues, the GIDL supply voltage circuit 610 may be configured to protect transistor M15 when the circuit 600 is in the ON state. The GIDL supply voltage circuit 610 may be configured to protect transistor M15 by maintaining a source voltage for transistor M15 less than the supply voltage $V_{dd}$.

The GIDL supply voltage circuit 610 may be disposed between the source of transistor M15 and the gate of transistor M11. The GIDL supply voltage circuit includes transistor M13 and transistor M14. Transistors M13 and M14 may be coupled in series such that the source of transistor M13 is coupled to the gate of transistor M11, the drain of transistor M13 is coupled to the source of transistor M14, and the drain of transistor M14 is coupled to the source of transistor M15. The voltage at the gate of transistor M13 is the voltage at the drain of transistor M1 of the power supply circuit 305, and in some examples, the gate of transistor M13 may be electrically coupled to the drain of transistor M1. The gate of transistor M14 is coupled to the supply voltage $V_{dd}$.

When the circuit 600 is in the ON state (e.g., transistor M8 is ON), the enable signal is ON (e.g., high) and the gate voltage of transistor M8 is $V_g=V_{in}+V_{dd}$. Because the inverted enable signal is OFF (e.g., low, 0V), GIDL into transistor M15 can leak significant charge off Vg and cause Vg to droop. Accordingly, in some examples, if $V_{dd}$ is less than a GIDL threshold, transistor M14 eliminates GIDL into transistor M15 by maintaining its source voltage less than supply voltage $V_{dd}$. In some examples, if $V_{dd}$ is greater than a GIDL threshold, transistor M14 self-limits GIDL into M15.

In some examples, transistor M13 is configured to protect transistor M14 from GIDL issues. When the circuit 600 is in the ON state (e.g., transistor M8 is ON and the gate voltage of M8 is $V_g=V_{in}+V_{dd}$, if $V_{in}$ is greater than a GIDL threshold (e.g., 0.7 V), transistor M13 self-limits GIDL into transistor M14. As stated previously, transistor M13 self-limits since as GIDL increases, so does transistor M13's overdrive, which decreases the drain of transistor M14 until a limiting point is reached. In some examples, to increase its overdrive, transistor M13 is made small. When the voltage at the gate of transistor M13 ($V_b$) goes to supply voltage $V_{dd}$ when the circuit is OFF, the maximum voltage between the gate and source of M13 is equal to supply voltage $V_{dd}$ to avoid reliability issues.

Figure 7:
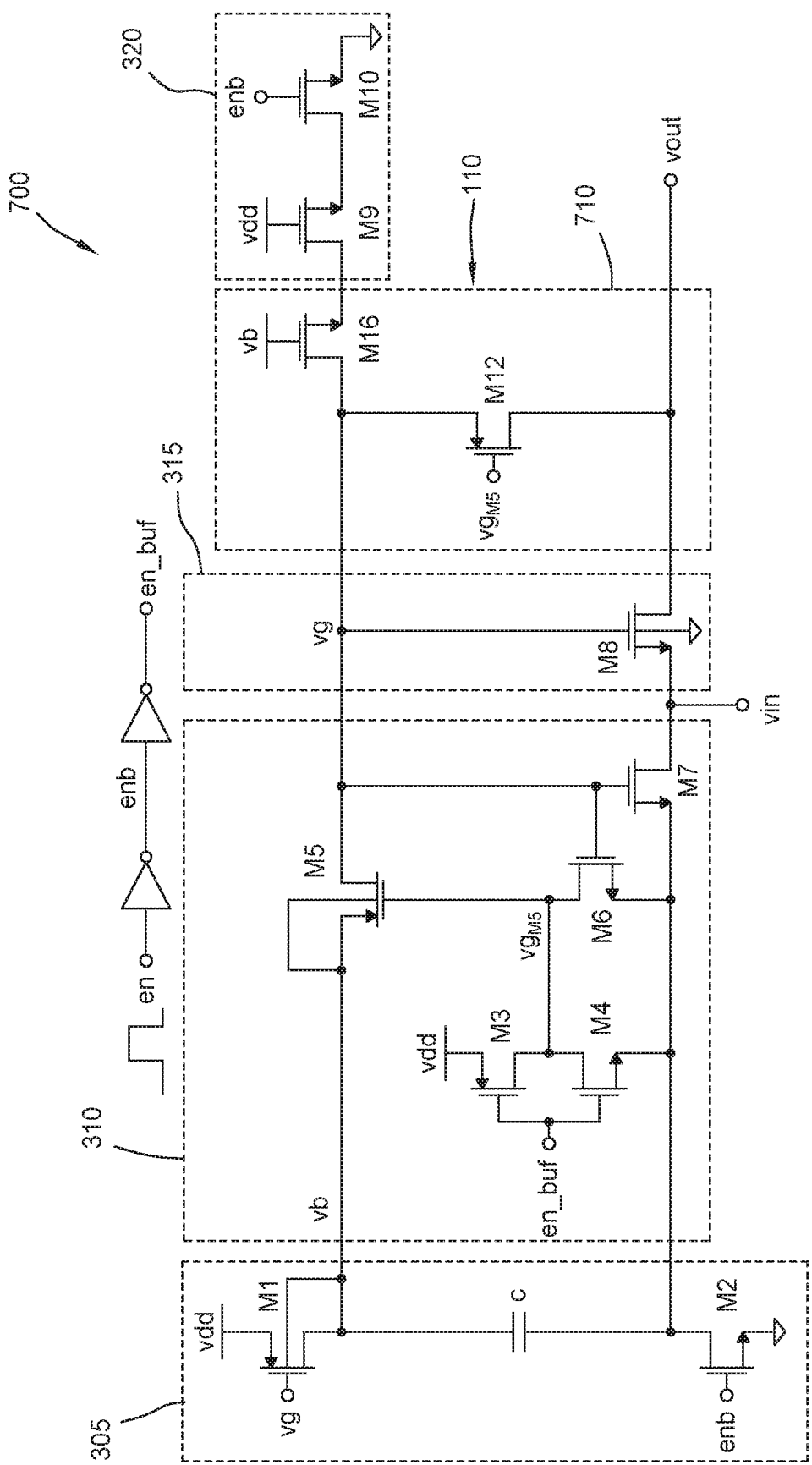
FIG. 7 illustrates components of the GIDL protection circuit, according to some examples.

FIG. 7 illustrates components of the GIDL protection circuit, according to some examples. As illustrated previously with FIGS. 3 and 5, the circuit 700 includes the GIDL protection circuit 110 connected between the gate and drain of the transistor M8 of the switch circuit 315, the drain of transistor M9 of the grounding circuit 320, and the output voltage $V_{out}$.

In some examples, the GIDL protection circuit 110 may comprise a ground protection circuit 710. The ground protection circuit 710 is configured to protect the grounding circuit 320—specifically, to prevent the voltage difference between the gate and drain of transistor M9 from exceeding a GIDL threshold (e.g., 0.7 V). The ground protection circuit is configured to prevent the GIDL issues illustrated in FIG. 4B. Accordingly, the ground protection circuit 710 is configured to maintain a drain voltage of transistor M9 less than the supply voltage $V_{dd}$ when the circuit 800 is in an ON state.

The ground protection circuit 710 comprises transistor M16, and in some examples, the ground protection circuit 710 may include transistor M12. As illustrated in FIG. 7, the source of transistor M16 is coupled to the gate of transistor M8, and the drain of transistor M16 is coupled to the drain of transistor M9 of the grounding circuit 320. In examples where the ground protection circuit 710 includes transistor M12, the source of transistor M12 is coupled to the gate of transistor M8 and the source of transistor M16, and the drain of transistor M12 is coupled to the drain of transistor M8. The voltage at the gate of the M12 is the voltage at the gate of transistor M5 of the enable circuit 310. In some examples, the gate of transistor M12 may be electrically coupled to the gate of transistor M5 of the enable circuit 310.

As mentioned, the ground protection circuit 710 is configured to protect the grounding circuit 320·specifically, to prevent the voltage difference between the gate and the drain of transistor M9 from exceeding a GIDL threshold. When the circuit 700 is in the ON state (e.g., transistor M8 is ON), the enable signal is ON (e.g., high) and the gate voltage of transistor M8 is $V_g = V_{in} + V_{dd}$. Accordingly, if $V_{in}$ is greater than a GIDL threshold (e.g., 0.7 V), transistor M16 self-limits GIDL into transistor M9. As stated previously, transistor M16 self-limits since as GIDL increases, so does transistor M16's overdrive, which decreases the drain of transistor M9 until a limiting point is reached. In some examples, to increase its overdrive, transistor M16 is made small. When the voltage at the gate of transistor M16 ($V_b$) goes to supply voltage $V_{dd}$ when the circuit is OFF, the maximum voltage between the gate and source of M16 is equal to supply voltage $V_{dd}$ to avoid reliability issues.

Figure 8:
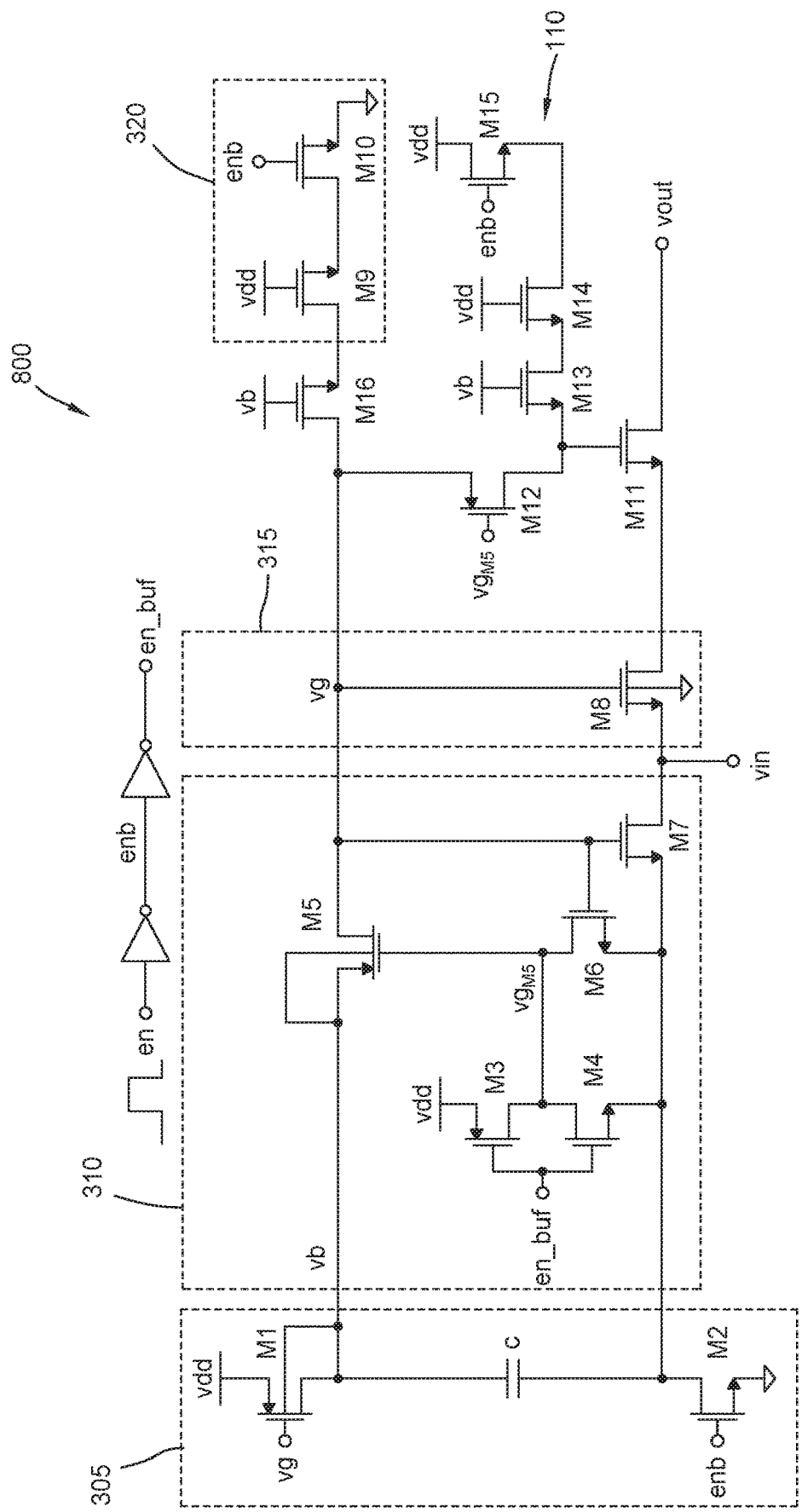
FIG. 8 illustrates components of a GIDL protection circuit, according to some examples.

FIG. 8 illustrates components of a GIDL protection circuit, according to some examples. As previously illustrated, the circuit 800 includes the GIDL protection circuit 110 connected between the gate and drain of the transistor M8 of the switch circuit 315, the drain of transistor M9 of the grounding circuit 320, and the output voltage $V_{out}$.

The GIDL protection circuit 110 in FIG. 8 includes the switch protection circuit 510 of FIG. 5, the GIDL supply voltage circuit 610 of FIG. 6, and the ground protection circuit 710 of FIG. 7. As illustrated, a single transistor M12 is disposed in the GIDL protection circuit 110 instead of having multiple transistors M12 in the GIDL protection circuit 110 for each of the switch protection circuit 510 and the ground protection circuit 710. By including each of the switch protection circuit 510, the GIDL supply voltage circuit 610, and the ground protection circuit 710, the GIDL protection circuit 110 provides a robust solution to preventing GIDL issues or protecting the circuit 800 from GIDL issues.

Figure 9:
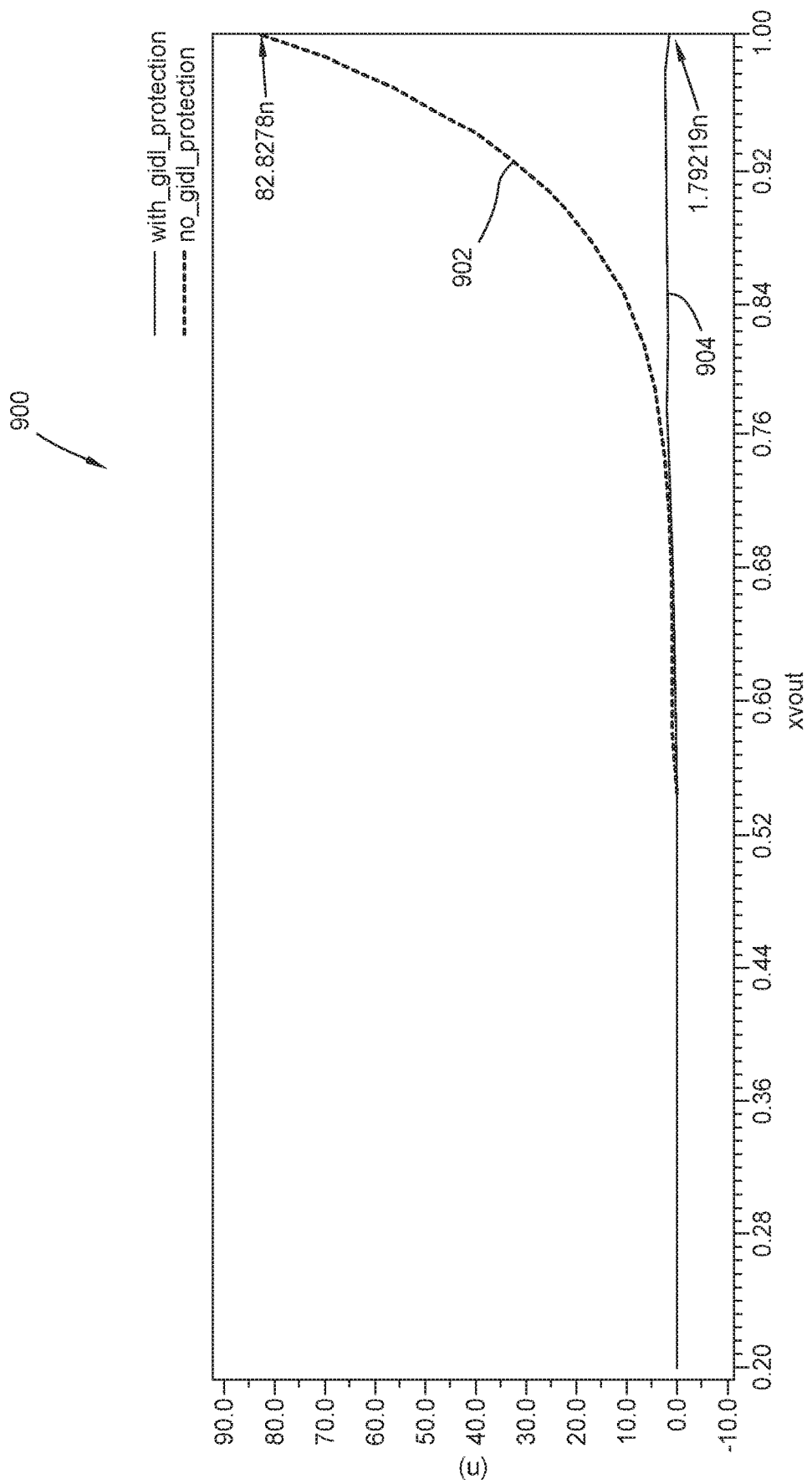
FIG. 9 is a graph of drain current with and without GIDL protection circuit.

FIG. 9 is a graph of drain current with and without GIDL protection circuit. The graph shows the drain current in the bootstrapped circuit with and without the GIDL protection circuit when the circuit is in the OFF state (e.g., $V_g = 0V$) for an output voltage from 0 to 1V where $V_{dd} = 0.9V$. Line 902 illustrates the drain current into the switch caused by GIDL, and according to line 902, the drain current increases exponentially as output voltage ($V_{out}$) increases. However, according to line 904, with the GIDL protection circuit, the drain current into the switch caused by GIDL has been decreased.

Figure 10:
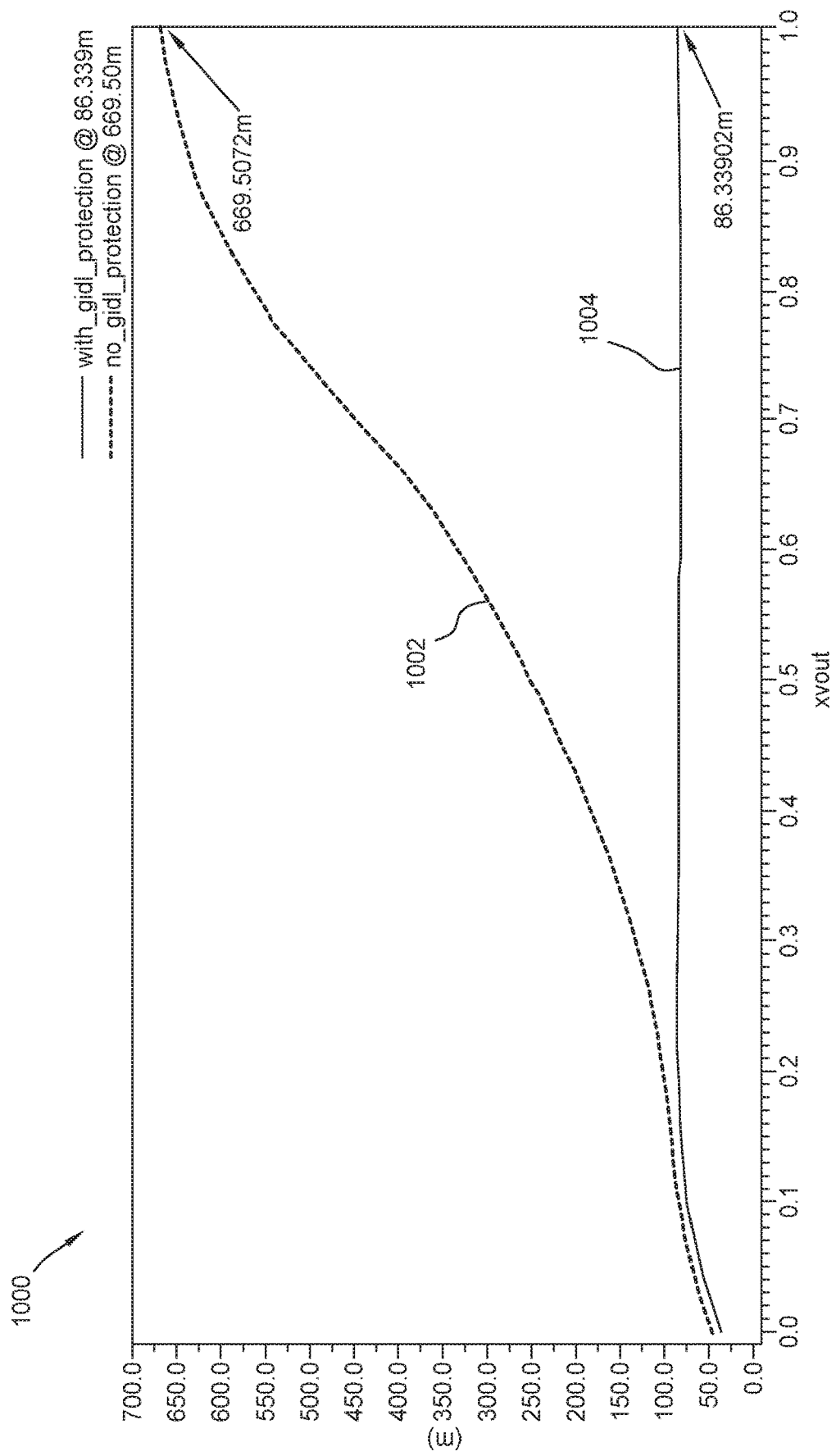
FIG. 10 is a graph of voltage droop over a period of time with and without GIDL.

FIG. 10 is a graph of voltage droop over a period of time with and without the GIDL protection circuit. The graph shows the voltage droop in the gate voltage to the M8 transistor over a 4 μs period when the switch is on. Line 1002 illustrates the voltage droop without the GIDL protection for an output voltage between 0 and 1 where $V_{dd} = 0.9$ V. Line 1004 illustrates the voltage droop with the GIDL protection circuit. Accordingly, the GIDL protection circuit reduces charge leakage off the switch gate due to GIDL.

Accordingly, examples presented herein provide a fully GIDL robust bootstrapped switch circuit. The GIDL robust bootstrapped switch circuit may be verified to work across (PVT), and reliability has been maintained in the circuit by ensuring $V_{gs}$ and/or $V_{ds}$ is less than or equal to supply voltage $V_{dd}$ on all additional transistors.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Aspects of the present disclosure are described below with reference to flow chart illustrations and/or block diagrams of methods, apparatus (systems) and computer program products according to embodiments presented in this disclosure. The flow chart and block diagrams in the figures illustrate the architecture, functionality, and operation of possible implementations of systems, methods, and computer program products according to various examples of the present disclosure. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flow chart illustration, and combinations of blocks in the block diagrams and/or flow chart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An apparatus, comprising:
a circuit having a grounding circuit, and a switch; and
a gate induced drain leakage (GIDL) protection circuit coupled to the switch and to an output voltage, the GIDL protection circuit comprising:
a switch protection circuit configured to maintain a drain voltage of the switch less than a first supply voltage ($V_{dd}$) when the circuit is in an OFF state; and
a ground protection circuit configured to maintain a drain voltage of the grounding circuit less than the first supply voltage when the circuit is in an ON state.

2. The apparatus of claim 1, wherein the switch protection circuit comprises a GIDL-supply-voltage circuit configured to maintain a source voltage for the switch protection circuit less than the first supply voltage.

3. The apparatus of claim 1, wherein the first supply voltage is less than or equal to a GIDL threshold voltage.

4. The apparatus of claim 1, wherein a difference between a gate voltage and a source voltage is less than or equal to the first supply voltage.

5. The apparatus of claim 1, wherein a difference between the drain voltage and a source voltage is less than or equal to the first supply voltage.

6. The apparatus of claim 1, wherein the switch comprises a thin oxide.

7. An apparatus, comprising:
a switch circuit, comprising a first transistor, a first gate transistor, and a second gate transistor; and
a gate induced drain leakage (GIDL) protection circuit coupled to the switch circuit, the GIDL protection circuit comprising:
a first transistor circuit coupled to a gate ($V_g$) and a drain of the first transistor; and
a second transistor circuit coupled to the first transistor circuit and to the drain of the first gate transistor.

8. The apparatus of claim 7, wherein the first transistor circuit comprises:
a second transistor having a source coupled to the gate of the first transistor;
a third transistor having a gate coupled to a drain of the second transistor and a source coupled to the drain of the first transistor.

9. The apparatus of claim 8, wherein a voltage of the gate of the third transistor increases to a voltage of the gate of the first transistor when the switch circuit is ON.

10. The apparatus of claim 8, wherein the first transistor circuit further comprises:
a fourth transistor having a source coupled to the gate of the third transistor and to the drain of the second transistor.

11. The apparatus of claim 8, wherein the GIDL protection circuit further comprises:
a third transistor circuit coupled to the drain of the first transistor circuit of the first transistor circuit and to the gate of the third transistor of the first transistor circuit, the third transistor circuit comprising:
a fourth transistor;
a fifth transistor having a source coupled to a drain of the fourth transistor; and
a sixth transistor having a source coupled to a drain of the fifth transistor.

12. The apparatus of 11, wherein the fifth transistor is configured to maintain a voltage at the source of the fifth transistor less than a first supply voltage ($V_{dd}$) when the first supply voltage is less than a GIDL threshold.

13. The apparatus of 11, where the fifth transistor is configured to maintain a voltage at the source of the fifth transistor greater than a first supply voltage ($V_{dd}$) when the first supply voltage is greater than a GIDL threshold.

14. The apparatus of claim 11, wherein the second transistor circuit comprises:
a seventh transistor having a source coupled to the gate of the first transistor and a drain coupled to the drain of the first gate transistor.

15. The apparatus of claim 14, wherein a maximum voltage difference between a gate and a source of the seventh transistor equals a first supply voltage when the switch circuit is OFF.

16. The apparatus of claim 11, wherein a maximum voltage difference between a gate and a source of the fourth transistor equals a first supply voltage when the switch circuit is OFF.

17. The apparatus of claim 11, wherein the sixth transistor comprises a gate coupled to an inverted enable signal (enb).

18. The apparatus of claim 7, wherein the second transistor circuit comprises:
a second transistor having a source coupled to the gate of the first transistor and a drain coupled to the drain of the first gate transistor; and
a third transistor having a source coupled to the gate of the first transistor and a drain coupled to the drain of the first transistor.

19. The apparatus of claim 7, wherein the first transistor, the first gate transistor and the second gate transistor comprise thin oxides.

20. A bootstrapped switch comprising:
a transistor;
a power supply circuit coupled between a gate of the transistor and a source of the transistor; and
a GIDL protection circuit configured to maintain a drain voltage of the transistor less than a first supply voltage ($V_{dd}$) when the transistor is in an OFF state and to maintain a drain voltage of a grounding circuit less than the first supply voltage when the transistor is in an ON state.

* * * * *

UNITED STATES PATENT AND TRADEMARK OFFICE
CERTIFICATE OF CORRECTION

PATENT NO. : 11,190,178 B1
APPLICATION NO. : 17/083191
DATED : November 30, 2021
INVENTOR(S) : Diarmuid Collins, Edward Cullen and Ionut C. Cical It is certified that error appears in the above-identified patent and that said Letters Patent is hereby corrected as shown below:

In the Claims

Column 10, Line 4, In Claim 11, after "transistor circuit" delete "of the first transistor circuit".

Signed and Sealed this
Twenty-sixth Day of April, 2022

Katherine Kelly Vidal
Director of the United States Patent and Trademark Office